United States Patent [19]

Wang

[11] Patent Number: 5,612,535
[45] Date of Patent: Mar. 18, 1997

[54] SPIN-SPLIT SCANNING ELECTRON MICROSCOPE

[76] Inventor: Youqi Wang, 3748 Redwood Cir., Palo Alto, Calif. 94306

[21] Appl. No.: 659,218

[22] Filed: Jun. 7, 1996

[51] Int. Cl.$^6$ ................................................. H01J 37/252
[52] U.S. Cl. ................................................. 250/310
[58] Field of Search ................................. 250/310, 311, 250/306, 307, 294, 295, 296, 281, 282

[56] References Cited

U.S. PATENT DOCUMENTS

| | | | |
|---|---|---|---|
| 3,714,422 | 1/1973 | Hosoki et al. | 250/310 |
| 4,998,788 | 3/1991 | Osakabe et al. | 350/3.8 |
| 5,371,388 | 12/1994 | Oda | 257/194 |

OTHER PUBLICATIONS

Connolly, Thom, "Total–Quality Manufacturing Taps Interferometry," Photonics, vol. 30:5, pp. 109–116 (May 1996).

*Primary Examiner*—Jack I. Berman
*Assistant Examiner*—Kiet T. Nguyen
*Attorney, Agent, or Firm*—Gary S. Williams; Flehr, Hohbach, Test, Albritton & Herbert

[57] ABSTRACT

A spin-split scanning electron microscope (SSSEM) uses a spin-split electron beam interferometer to measure the difference between two electron beam paths. By measuring the difference in path lengths, and/or measuring changes in the relative difference between the two paths as the electron beams are scanned over a surface, the topology of an object's surface may be measured. The measuring changes in the relative difference between the two paths as a material etching or material deposition or growth process is performed, the amount of material added or removed from an object's surface may be metered. The spin-split scanning electron microscope includes an electron beam source that generates a flying stream of electrons, a spin-split electron beam splitter splits the flying stream of electrons into first and second electron beams having different trajectories, an electron beam intensity detector that receives a reflected portion of the first and second electron beams after they have been reflected from distinct positions of a target surface and generates an intensity signal indicative of the received beams combined intensity; and a controller coupled that receives the intensity signal, and analyzes changes in the intensity signal to determine relative changes in path lengths of the first and second electron beams. The beam splitter includes a magnetic field generator that generates a non-uniform magnetic field in region of space intercepted by the flying stream of electrons which causes electrons having opposite magnetic moments to be deflected into two separate electron beams.

16 Claims, 5 Drawing Sheets

SPIN-SPLIT SCANNING ELECTRON MICROSCOPE

The present invention relates generally to devices and methods for precisely measuring the topology of a surface, such as the surface of an integrated circuit at various stages of processing, and particularly to an electron microscope interferometer suitable for integrated circuit (IC) metrology.

BACKGROUND OF THE INVENTION

As of 1996, the most advanced production-line silicon semiconductor circuit manufacturing processes use 0.35 micron technology, meaning that the minimum size of any circuit feature is 0.35 microns. This, in turn, requires the tools used to measure semiconductor device features to be accurate to approximately 0.035 microns. Production of devices with minimum feature sizes of 0.25 microns, 0.18 microns and less will be likely to take place within by 2001, and production of devices with 0.07 micron sizes is predicted to take place by 2010. However, it is not yet clear what metrological tools will be used to preform the measurements of such devices necessary to develop and accurately model the associated manufacturing processes. SEMs can generally be used to perform measurements with accuracy on the order of 0.05 microns. However, it would appear that SEM technology has been pushed to its limit. Further improvements in the accuracy of SEM based measurements of semiconductor devices are likely to be too limited to perform the metrology required for supporting semiconductor devices using feature sizes of 0.18 microns or less. The manufacture of integrated circuits is a complicated and expensive process sometimes involving dozens of process steps. To ensure that this manufacturing effort is not wasted, steps of the IC fabrication process modeled in process simulators to determine beforehand whether resulting device features will have the desired width, thickness, cross-sectional profile, etc.

Results generated by process simulators, such as PROLITH/2™ and SAMPLE™ are typically verified through scanning electron microscope (SEM) examination of a cross section and feature widths of a photolithographically defined surface. However, while SEM verification is adequate for relatively large-scale features (i.e., a few microns and up), SEMs are generally not able to capture critically important cross-sectional details of features defined by submicron photolithography. One reason for this is that SEMs charge the sample under examination with electrons, which has the effect of blurring edges on photographs taken of the imaged surface. While blurring is not a significant problem for surfaces with macroscopic features, it tends to obliterate submicron details. Another problem with SEM metrology is that, typically, IC feature sizes are determined by direct measurement of the SEM photographs with a precision ruler.

Besides the obvious problem of making measurements from the blurred edges described above, direct measurement can result in additional errors due to (1) incorrect placement of the ruler on the edge of a photographed feature (assuming the feature edge is identifiable) and (2) the difficulty of measuring the pitch or angle of a cross-sectional feature with a ruler. In the case of submicron devices, these errors can amount to a significant percentage of the feature being imaged. Additionally, SEMs can physically alter the device features being measured.

Other aspects of process models in need of verification include basic process variables such as the developing rate associated with a particular developing solution. By developing a semiconductor wafer in stages and measuring the change in surface profile after each stage, developing rates can be better quantified, resulting in a more accurate process model. However, given the above mentioned measurement errors associated SEM surface imaging, it is not possible to accurately quantify such process variables using SEM metrology.

Moreover, given the inherent lack of reliability (i.e., reproducibility of measurements) of SEM metrology as applied to submicron features, it is not possible to use SEM measurements to iteratively adjust the process simulator to model better the results of a particular IC manufacturing process. That is, the SEM is better suited to rough verification of a model rather than incremental improvement of a model.

Finally, given the current lack of a reliable method for verifying and updating process models with respect to submicron IC device features, it is not currently possible to modify IC manufacturing/processing steps in accordance with the predictions of an improved process simulator. Consequently, there is a need for an IC process model verification system that incorporates a measuring device that can accurately measure the cross sections of submicron device features. There is also a need for a measuring device that can measure surface profile changes during the performance of semiconductor processing steps.

SUMMARY OF THE INVENTION

In summary, the present invention is a spin-split scanning electron microscope (SSSEM) which uses a spin-split electron beam interferometer to precisely measure the difference between two electron beam paths. By measuring the difference in path lengths, and/or by measuring changes in the relative difference between the two paths as the electron beams are scanned over a surface, the topology of an object's surface may be precisely measured. Similarly, by measuring changes in the relative difference between the two paths as a material etching or material deposition or growth process is performed, the amount of material added or removed from an object's surface may be precisely metered.

The spin-split scanning electron microscope includes an electron beam source that generates a flying stream of electrons, a spin-split electron beam splitter that splits the flying stream of electrons into first and second electron beams having different trajectories, an electron beam intensity detector that receives a reflected portion of the first and second electron beams after they have been reflected from distinct positions of a target surface and generates an intensity signal indicative of the received beams combined intensity; and a controller coupled that receives the intensity signal and analyzes changes in the intensity signal to determine relative changes in path lengths of the first and second electron beams.

The spin-split electron beam splitter includes a magnetic field generator that generates a non-uniform magnetic field in region of space intercepted by the flying stream of electrons. The electrons in the flying stream of electrons each having a magnetic moment (i.e., spin-up or spin-down), a first portion of the electrons having a first alignment orientation (e.g., spin-up) with the magnetic field and a second portion of the electrons having a second alignment orientation (e.g., spin-down) with the magnetic field that is the opposite of the first alignment orientation. The first portion of the electrons in the flying stream, after flying through the non-uniform magnetic field, becomes the first electron beam and the second portion of the electrons in the flying stream, after flying through the non-uniform magnetic field becomes the second electron beam.

The spin-split electron beam splitter also includes a transverse electric field generator for applying an electric field to the flying stream of electrons to at least partially compensate for a Lorentz force experienced by the flying stream of electrons while flying through the magnetic field.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1A:
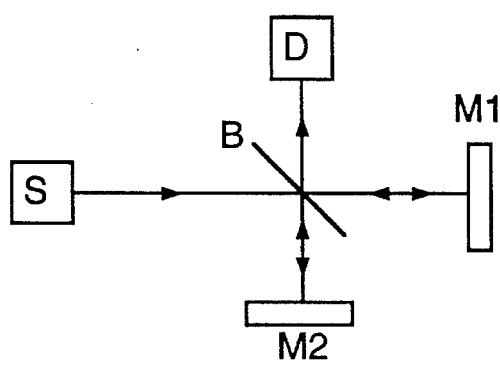
FIGS. 1A and 1B schematically depict the light beam paths in an optical interferometer and an optical telemicroscope.

Referring to FIG. 1A, them is shown a typical arrangement of an optical interferometer. A monoenergetic optical beam is generated by the source (S), such as a laser, and is subsequently split by a beam splitter (B) into two beams. The two beams travel through different pathways and then recombine to yield an interference signal at the detector (D). The detected signal is a function of the difference between the two paths as well as the beam energy.

Figure 1B:
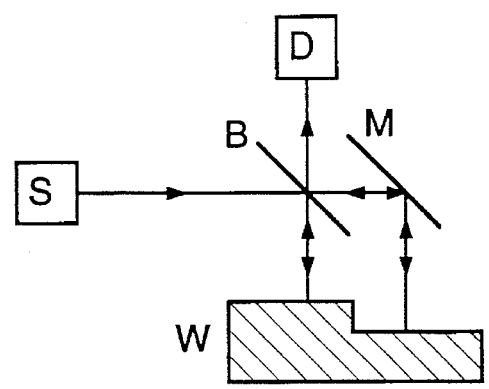

The interferometer of FIG. 1A can be converted into an optical telemicroscope by slight modification, as shown in FIG. 1B, in which the two mirrors are replaced by a sample with a reflective surface. The mathematical description of the telemicroscope is that of the two wave functions $\Psi_1$ and $\Psi_2$ of the two beams at the detection point:

$$\psi_1 = A\exp\left[ i\frac{E}{\hbar}\left(\frac{x}{c} - t\right) \right], \qquad (1)$$

$$\psi_2 = A\exp\left[ i\frac{E}{\hbar}\left(\frac{x+\delta x}{c} - t\right) \right]$$

where A is the beam intensity, E is the beam energy (E=hv), x is the optical distance along one of the optical paths, $\delta x$ is the path difference of the beam paths, c is the speed of light ($3.00\times10^8$ meters/sec), h is equal to $h/2\pi n$, and h is Plank's constant ($6.626\times10^{-34}$ joule-sec). For the sake of simplicity, the two beams are assumed to have the same strength. Although, in reality, the two beams will have different strengths from each other by some amount, depending on the detailed topology as well as material compositions within each spot (and other factors not relevant here), this will not alter the essence of the mathematical relationship. The detected wave intensity, I, is then determined by:

$$I \propto |\psi_1 + \psi_2|^2 \propto \left| 1 + \exp\left[ i\frac{E\delta x}{\hbar c} \right] \right|^2 = 2 + 2\cos\left[ \frac{E\delta x}{\hbar c} \right] \qquad (2)$$

where h is equal to $h/2\pi n$. The above equation shows that the detected intensity is a function of both the path as well as the beam energy. Note that the path difference, $\delta x$, contains information regarding the surface topology of the sample. To obtain $\delta x$ from the detected signal, the telemicroscope may be operated in a modulated-energy mode. As an example, consider a saw-tooth type of modulation of the optical beam energy:

$$E = E_0 + \delta E \frac{t}{T} \qquad (3)$$

where t is the sweeping time variable, and T is the sweeping period. The modulation can be realized, for example, by an optical parametric oscillator (OPO), a free-electron laser, or a white-light source with a grating device. When using a white-light source and grating device, the grating's angle can be modulated so as to modulate the color and thus the energy of the resulting optical beam. Substituting equation (3) into equation (2) gives:

$$I \propto 2 + 2\cos\left[ \frac{\delta E \delta x}{\hbar c}\left(\frac{t}{T}\right) + \theta \right], \theta \equiv \frac{E_0 \delta x}{\hbar c} \qquad (4)$$

Thus, by sweeping the beam energy and recording the corresponding changes of the interference signal, the optical path difference information, $\delta x$, is readily obtained. More specifically, the value of $\delta x$ is determined by counting the number of oscillations N of the interference signal while the beam energy is swept and then multiplying that number N by $hc/\delta E$. Then, by scanning the beams over a surface, information on the surface's topology is easily obtained by monitoring oscillations of the interference signal and converting those oscillations into optical path changes representative of changes in the height of the surface.

The horizontal resolution of the telemicroscope described above is determined by the spot size of the beams on the target, which can be focused down to the size of the optical wavelength. The vertical resolution is mainly determined by the wavelength of the optical source, the modulation depth, $\delta E$, and the signal to noise ratio (SNR) of the detector.

It should be emphasized that this third dimension is not attainable using conventional microscopes, whether optical microscopes or electronic microscopes. Also, the absolute path length of the beams, x, is irrelevant to the telemicroscope. Hence, one can use such a device to obtain topological information on mountains or valleys of the Moon or Mars from the Earth (or a satellite), as long as the reflected beams are strong enough at the detection point or the detector is sensitive enough.

Figure 2:
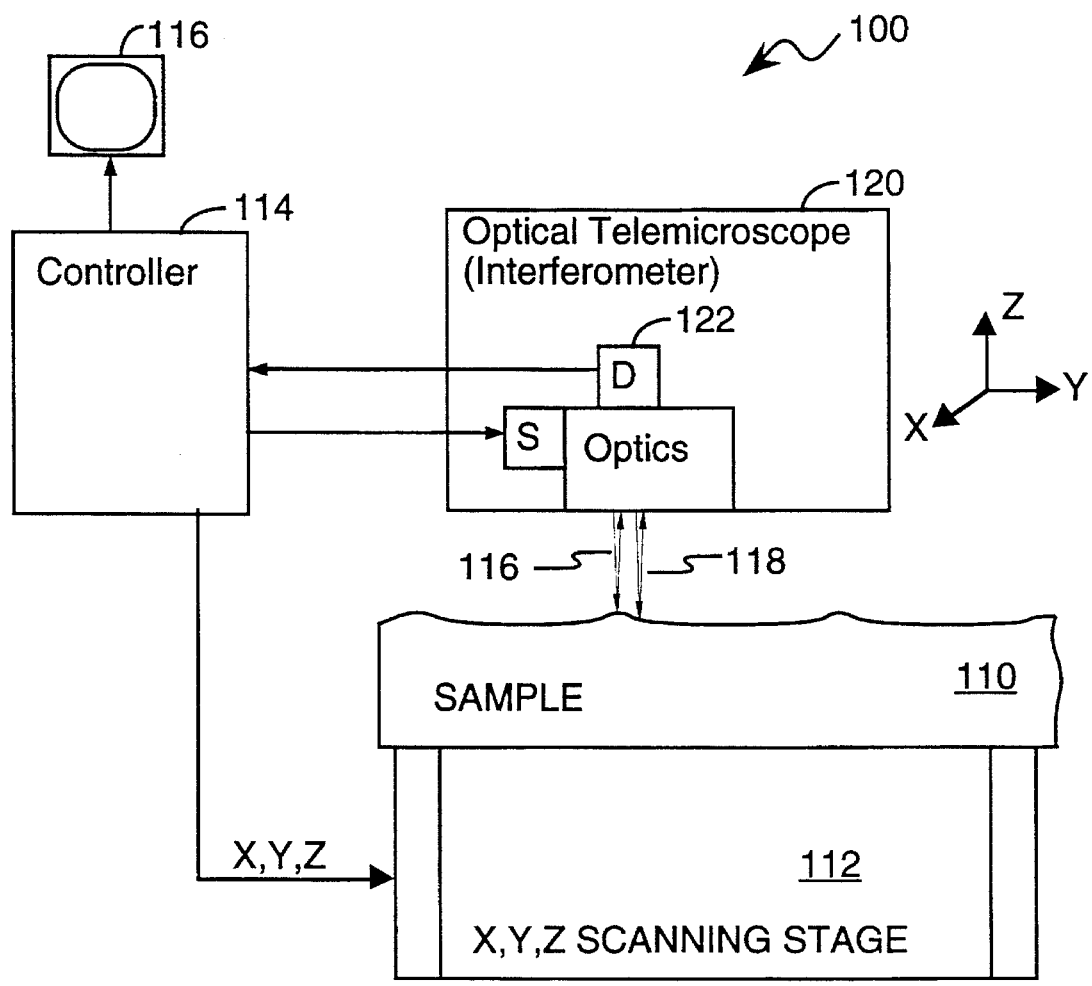
FIG. 2 is a block diagram of a surface topology measurement system using an optical telemicroscope.

Referring to FIG. 2, a telemicroscope can also be operated in a constant-energy mode. FIG. 2 shows a semiconductor wafer topology measurement system 100 in which a wafer or other sample 110 whose surface topology is to be measured is mounted on a scanning stage 112 that moves the wafer 100 under the direction of a controller 114. An optical telemicroscope 120 is positioned above the wafer 110, projects optical beams 116, 118 onto the surface of the wafer, and transmits back to the controller data representing the intensity of the optical signal received by the telemicroscope's detector 122. The stage 112 may also be used to move the sample vertically, in the Z direction, such as when the telemicroscope 120 is being focused.

The controller 114 sends control signals to the stage 112 that cause the sample to move smoothly in the X and Y directions under the telemicroscope 120 and also sends signals to the telemicroscope to control the beam energy used by the telemicroscope 120. As the sample 110 is moved under the telemicroscope, the controller 114 monitors changes in the optical signal intensity detected by the detector 122, and from those changes it determines the relative height of the sample's surface at each scanned surface position relative to the other scanned surface positions. The resulting topology data may be displayed on display 116.

In such operation the beam energy is fixed and the sample is scanned. If the scanned surface is uniformly flat and the beam path difference, δx, does not vary during a scan, the intensity of the interference signal received by the detector 122 will be constant. On the other hand, if the scanned surface is not entirely flat and δx varies during the scan, the interference signal will vary in a quantitative manner according to Equation 2. A constant-energy mode of operation is also useful in wafer processing, especially for in-line (in-process) monitoring and control, for example during thin film deposition and during etching. In such applications the spot size is not a critical issue and optical lenses can be used to focus a beam down to its diffraction limit.

Spin-Split Scanning Electron Microscope

While based on the same principles as the telemicroscope described above, the spin-split scanning electron microscope (SSSEM) of the present invention utilizes the fact that electrons are waves (de Broglie waves), and thus can have wave interference under appropriate conditions, and also utilizes the fact that electrons have an intrinsic angular momentum (electron spin), which can be used to split an electron beam into two beams that are identical except for their spin orientation.

The major advantage of using electrons as the path length information carrier in a telemicroscope in place of coherent light is that the wavelength of electrons can be made much shorter than the wavelength of photons, and therefore the vertical resolution of the telemicroscope can be made much higher.

Figure 3:
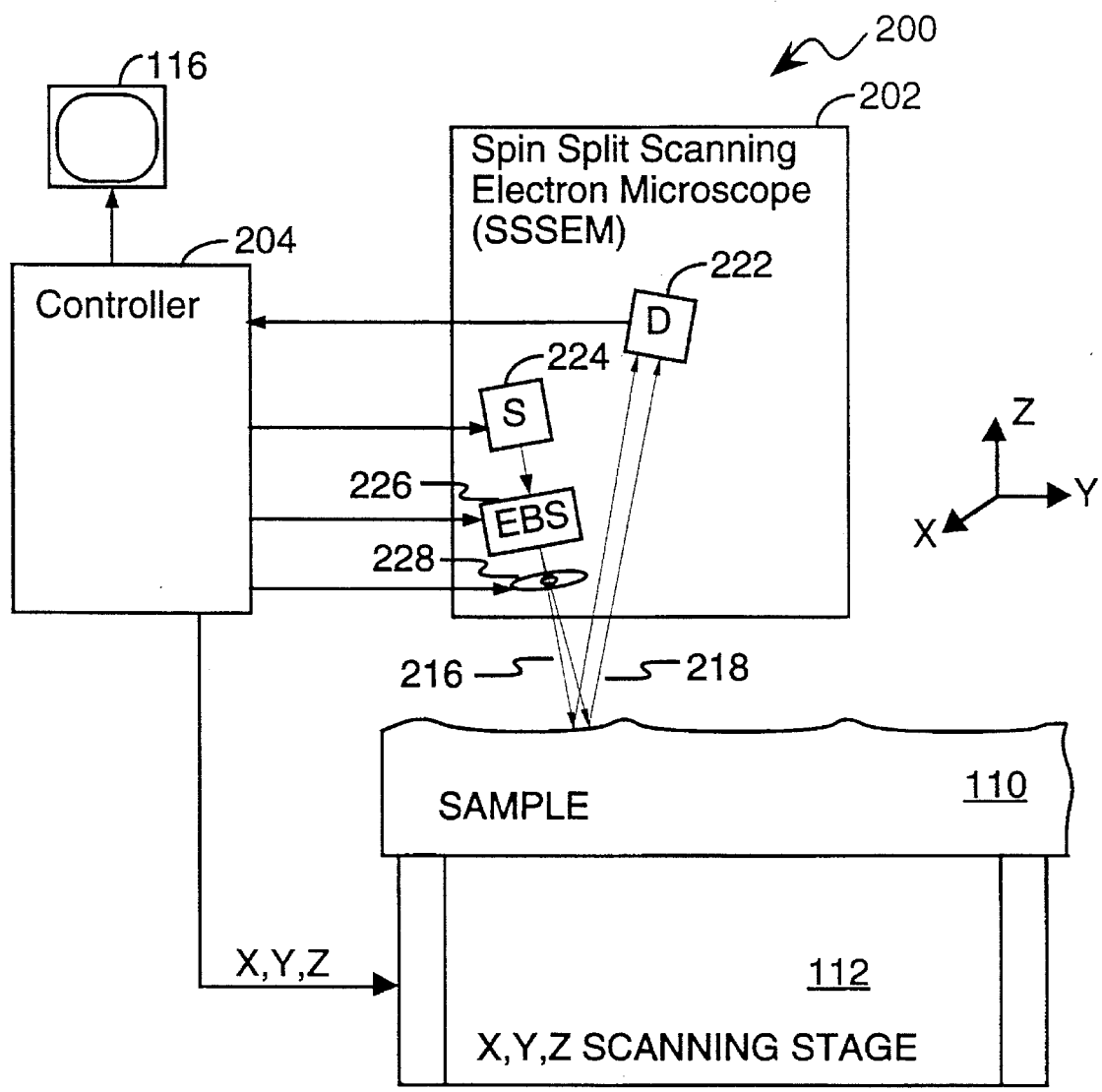
FIG. 3 is a block diagram of a surface topology measurement system using a spin-split scanning electron microscope (SSSEM) in accordance with the present invention.
Figure 4:
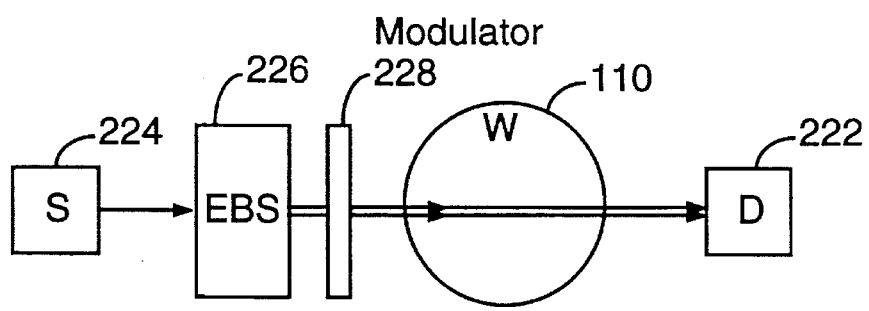
FIG. 4 is top view of a spin-split scanning electron microscope (SSSEM) in accordance with the present invention.
Figure 5:
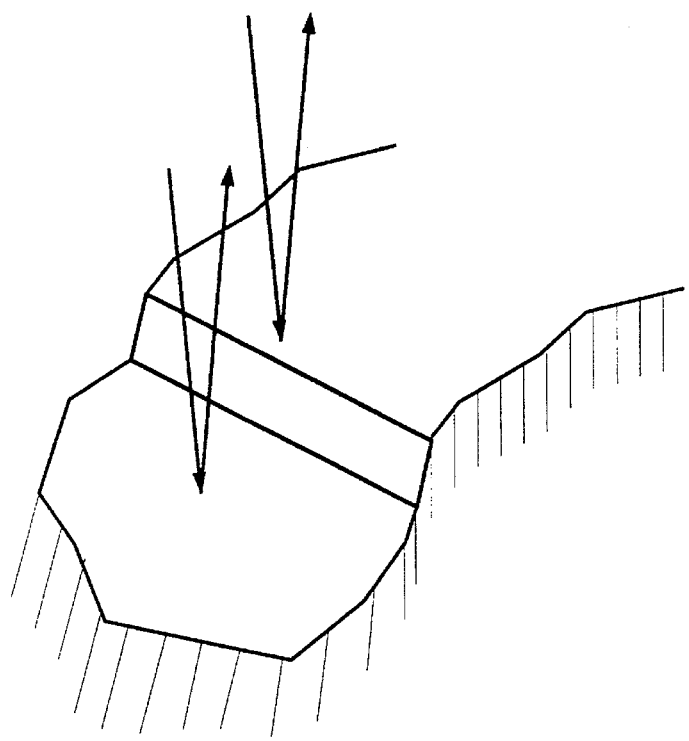
FIG. 5 is perspective view of electron beam paths in a spin-split scanning electron microscope (SSSEM) in accordance with the present invention.

FIGS. 3, 4 and 5 show three views of a SSSEM. In the preferred embodiment of a semiconductor wafer topology measurement system 200 incorporating an SSSEM 202 of the present invention, a wafer or other sample 110 whose surface topology is to be measured is mounted on a scanning stage 112 that moves the wafer 100 under the direction of a controller 204. An SSSEM 202 is positioned above the wafer 110, projects electron beams 216, 218 onto the surface of the wafer, and transmits back to the controller data representing the intensity of the interference signal received by the telemicroscope's detector 222.

Figure 8:
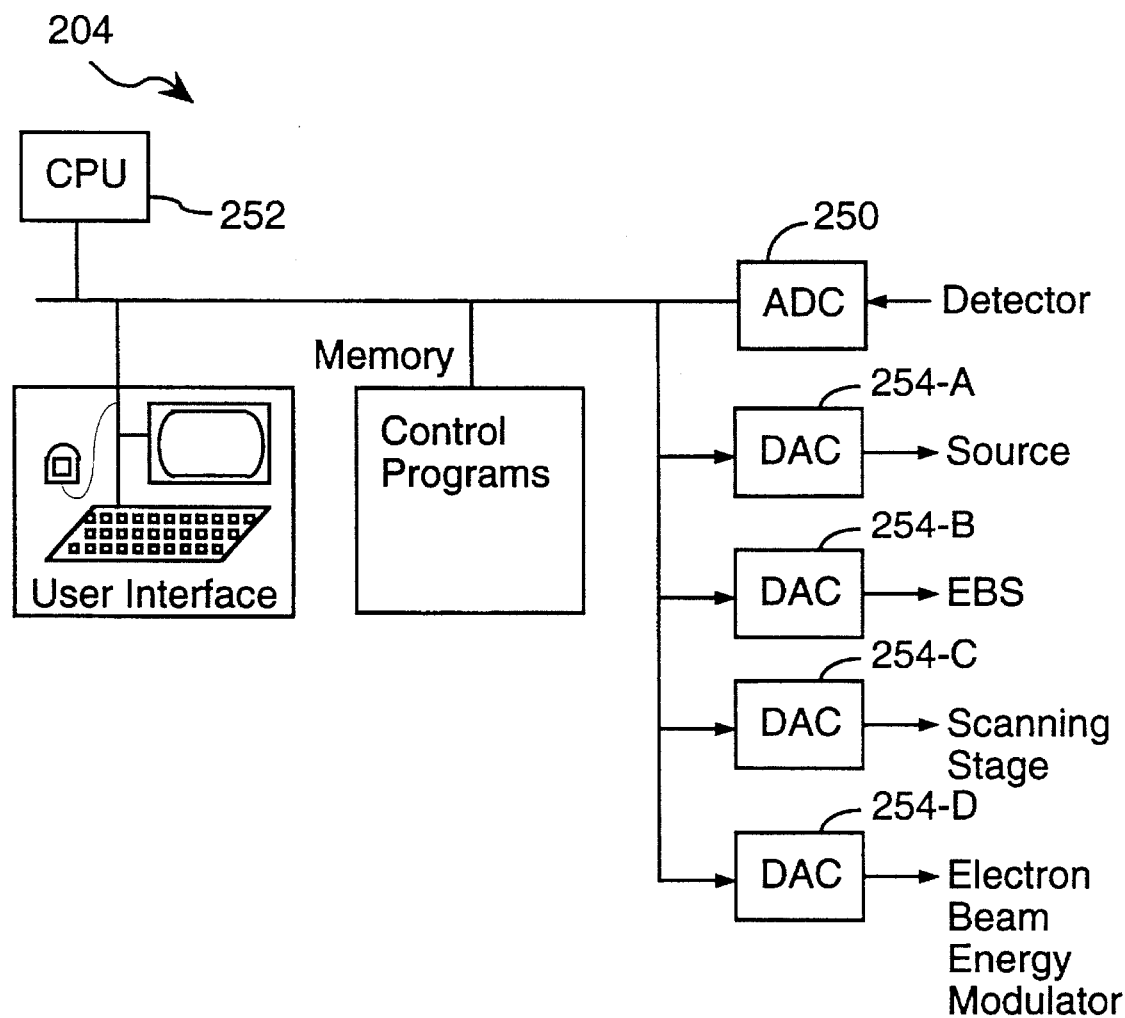
FIG. 8 is a block diagram of the controller for a surface topology measurement system using a spin-split scanning electron microscope (SSSEM) in accordance with a preferred embodiment of the present invention.

The controller 204 sends control signals to the stage 112 that cause the sample to move smoothly in the X and Y directions under the SSSEM 202 and also sends signals to the SSSEM 202 to control the electron beam energy used by the SSSEM 202. The scanning stage 112 may be a "piezo scanning tube" type of stage, which uses piezoelectric actuators to precisely move the sample 110 in the X, Y and Z directions. The SSSEM 202 is kept stationary while the scanning stage 112 moves the sample 110 so as to scan the sample's surface. As the sample 110 is moved under the SSSEM 202, the controller 204 monitors changes in the interference signal intensity detected by the detector 222, and from those changes it determines the relative height of the sample's surface at each scanned surface position relative to the other scanned surface positions. The resulting topology data may be displayed on display 116. Referring to FIG. 8, the controller 204 includes an analog to digital converter (ADC) 250 for converting the electron intensity signal generated by the detector 222 into a digital signal suitable for processing by a programmed digital signal processor or data processor 252. In addition, the controller will typically include a set of digital to analog signal converters 254 for sending control signals to the SSSEM and the scanning stage or a wafer processing chamber. In the SSSEM 202, a monoenergetic electron beam is generated by an electron beam source 224 and is subsequently split by the electron beam splitter (EBS) 226 into two beams 216, 218. The two beams 216, 218 are accelerated and their energy is modulated by an electron-beam modulator 228. The modulator 228 is typically a metal ring or cylinder onto a voltage is applied. That voltage sets or adjusts the kinetic energy of the electrons in the beams and thus governs the velocity of the electrons. In some embodiments the voltage on the modulator 228 is modulated. Energy modulation is used in some modes of operation so as to precisely measure the difference in the path lengths of the two beams, as will be described in more detail below. Energy modulation can also used to help reduce the affect of noise on the signal detector. The two beams are then reflected by the sample surface at different spots and then recombined to yield an interference signal at the detector 222. As in the case of the optical telemicroscope, the observed interference signal is a function of the different lengths of the beam paths as well as the beam energy. Thus, by scanning the beams over a sample and recording the corresponding change in the interference signal, information indicating the relative height Z of the sample at each X, Y position can be determined.

For the purposes of this document, the term "surface topology" of a sample shall be defined to mean the relative height Z of the sample at each scanned horizontal position X, Y.

The mathematical description of the SSSEM is similar to that of an optical telemicroscope. The wave functions $\Psi_1$ and $\Psi_2$ Of the two electron beams at the detection point are written as:

$$\psi_1 = A\exp\left[\frac{i}{\hbar}(\sqrt{2m_eE}\ x - Et)\right], \quad (5)$$

$$\psi_2 = A\exp\left[\frac{i}{\hbar}(\sqrt{2m_eE}\ (x+\delta x) - Et)\right]$$

where A is the beam intensity, E is the kinetic energy of the electron beam, x is the optical distance along one of the optical paths, and δx is the path difference of the beam paths. The detector current I is then:

$$I \propto |\psi_1 + \psi_2|^2 \propto \left|1 + \exp\left[\frac{i}{\hbar}\sqrt{2m_eE}\ \delta x\right]\right|^2 = \quad (6)$$

$$2 + 2\cos\left[2\pi\delta x \frac{\sqrt{2m_e E}}{h}\right]$$

$$I \propto 2 + 2\cos\left[2\pi \frac{\delta x \sqrt{E}}{a}\right], a \equiv \frac{h}{\sqrt{2m_e \cdot eV}} = 1.2 \text{ nm} \quad (7)$$

In equation 7, E is expressed in units of electron volts (eV). Equation 7 indicates that if the probing beam has kinetic energy of 1 eV, then a change of path differential $\delta x$ by 1.2 nm (0.0012 microns) will cause the interference signal to display a complete cycle (e.g., from full constructive interference to destructive interference and then back to full constructive interference). Likewise, if the beam energy is 100 eV, then a 1.2 nm change in the path differential corresponds to 10 cycles of the interference signal.

In a fixed-energy mode of operation, the kinetic energy of the probing beams is kept constant and variations in the strength of the interference signal I are monitored, which correspond to variations in $\delta x$ in accordance with equation 7. The variations in $\delta x$ may be caused by a process, for example as during real time monitoring of a semiconductor manufacturing process such as deposition or etching. Variations in $\delta x$ may also be caused by the movement of the microscope relative to a semiconductor wafer, for example during a surface uniformity inspection or other quality control inspection, which can be realized by either moving the instrument relative to the wafer or moving the focal spots of the beams on the wafer surface.

Unlike optical beams, it is very easy to manipulate the kinetic energy of an electron beam. Kinetic energy is set simply by appropriately setting the voltage on the electron beam energy modulator 228. Thus, the modulated-energy mode of operation is easier to achieve in SSSEM than in optical telemicroscopes. For a saw-tooth mode of modulation, we have:

$$E = E_0 + \delta E \frac{t}{T}, \left|\frac{\delta E}{E}\right| \ll 1 \quad (8)$$

Substituting equation 8 into equation 7 gives:

$$I = 2 + 2\cos\left[2\pi \frac{\delta x}{b}\left(\frac{t}{T}\right) + \theta\right], \quad (9)$$

$$b \equiv \frac{2a}{\sqrt{E_0}}\left(\frac{\delta E}{E_0}\right)^{-1}, \theta \equiv 2\pi \frac{\delta x \sqrt{E_0}}{a}$$

If the modulation depth, $\delta E/E_0$, is chosen to be, for example, one percent (1%), and $E_o$ is set at 400 eV, then b=12 nm. Thus, if the absolute value of $\delta x$ is 12 nm, then the signal I will show a complete cycle of the interference signal during one sweeping period. If a double saw-tooth modulation mode (i.e., where the saw tooth signal pattern varies between $+\delta E$ and $-\delta E$) is used, then b=6 nm, and two cycles will be displayed. Hence, by appropriately setting the modulation depth as well as beam energy, a wide range of beam path differences $\delta x$ can be easily accommodated.

Figure 6A:
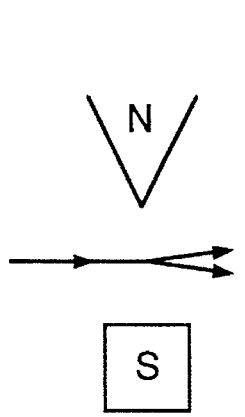
FIGS. 6A, 6B and 6C are three different cross-section views of an electron beam splitter used in a preferred embodiment of a spin-split scanning electron microscope (SSSEM) in accordance with the present invention.
Figure 6B:
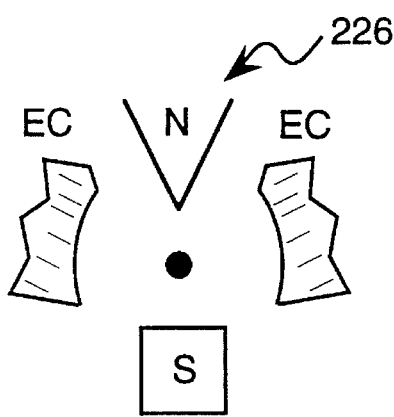
Figure 6C:
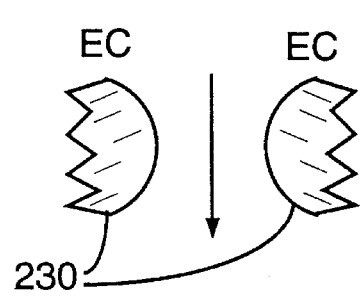
Figure 7:
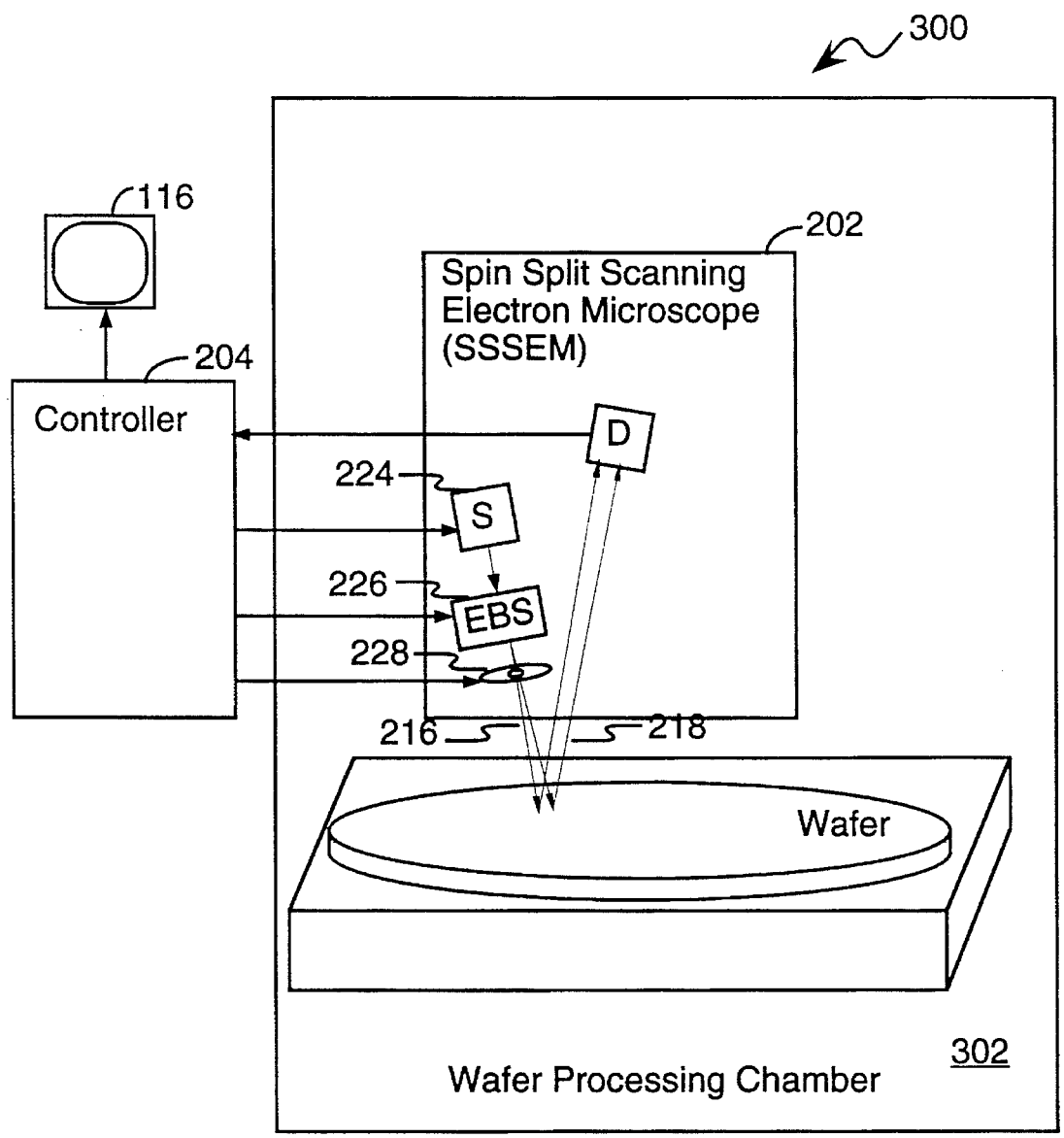
FIG. 7 is a block diagram of a wafer processing monitoring system using a spin-split scanning electron microscope (SSSEM) in accordance with the present invention.

Electron Beam Splitter The electron beam splitter (EBS) 226 utilizes the well established physical fact that an electron is also a tiny magnet (magnetic dipole) which can take only two distinctive orientations in the presence of a magnetic field. In a non-uniform magnetic field, the electron experiences a net force, governed by $$F = M \cdot \nabla B \quad (10)$$

where M is the magnetic moment of the electron and B is the magnetic field. Since the projection of M along the field is $M_z = \pm\beta$, $\beta$ being the Bohr magneton, an electron beam will be split into two identical beams when the beam traverses a non-uniform magnetic field, as shown schematically in Fig. 6A. The magnet 227 is preferably an electromagnet of non-uniform shape which generates a magnetic field when an electrical current is applied to the electromagnet's coil. The coil current of the magnet governs the strength of the magnetic field generated by the magnet. Since the splitting force is only a function of the field gradient rather than the field strength itself, a strong magnet is not necessarily needed. Furthermore, for the purpose of the SSSEM, the spatial separation of the electron beam spots on a sample surface should be small (e.g., sub-microns to tens of nanometers). Thus, a strong magnetic field gradient is also not necessary. As a result, a compact EBS 226 suitable for use in a semiconductor surface scanning SSSEM can be constructed with conventional components. Aside from the beam splitting force described above, there is also a Lorentz force experienced by flying electrons, which can be compensated by a transverse electric field. Hence, one of the design criteria of the EBS 226 is that along the beam path inside the EBS, an electric field compensator 230 must generate an electric field E whose strength and orientation are defined by:

$$E = -v \times B, \quad (11)$$

where E is the electric field and v is the electron velocity. The inside structure of the EBS is shown in FIGS. 6B and 6C. FIG. 6B shows a cross-section view of the EBS along a cross-section that is perpendicular to the electron beam path, while FIG. 6C shows a cross-section view of the EBS along a cross-section that is parallel to the beam path. The transverse electric field strength is controlled by the voltage applied on the electric field compensator (EC) 230 and the magnetic field strength is controlled by the coil current of the magnet. With a given setting for E and B, only a selected portion of the incoming electrons will pass through the EBS, as indicated by equation 11. Thus, the EBS can also serve as an electron energy selector. FIG. 7 shows a semiconductor processing system 300 in which an SSSEM 202 monitors the increase or decrease in the thickness of a thin film layer being deposited or etched in a semiconductor wafer processing chamber 302. By aiming one beam on a wafer surface position that is not being affected by the processing and focusing the other beam on a wafer surface position that is being affected by the processing relative changes in the surface height caused by the processing can be measured and monitored. In this way, when the amount of material deposited or etched reaches a predefined goal, the controller 204 can detect that condition and can signal the processing equipment 302 to stop the thin film deposition or etching process.

Additional Considerations

In reality, it is impossible to generate an electron beam with all the electrons having exactly the same kinetic energy. However, as indicated by equation 9, the dependency of the interference signal I on energy distribution is rather weak. For instance, if the average kinetic energy of an electron beam is 100 g eV while the energy spreading is 0.1 eV FWHM (full width at half maximum magnitude, i.e., the full width of the plot of electron population versus electron energy at half the maximum electron population), this energy variation is effectively equivalent to an energy variation $\delta E/E$ of 0.01%, which has only negligible effect on the interference signal. On the other hand, the beam generator in a commercial Electron Energy Loss Spectrometer (EELS) can easily generate a beam of 10 eV with energy spreading of less than 0.005 eV FWHM (in the best commercial EELS, energy spreading is less than 0.001 eV FWHM). In addition, an electron beam can be accelerated while leaving the energy distribution intact. Thus, electron beam energy distribution does not represent a problem in the construction and operation of SSSEM's.

In the above equations, both the beam path, x, and the difference of the paths, $\delta x$, actually refer to the average value of the corresponding entities (weighted by the beam intensity profile within the spots on the surface). Thus, if the surface is sufficiently rough within the scope of the spots, even an SSSEM might not work well. For example an SSSEM might not work well at mapping the contour of a human gene on a flat background. However, the surface features of silicon wafers are very flat at sub-micron scales. Thus, SSSEM is very suitable for measuring the topology of silicon wafers and for measuring changes in material thickness during silicon manufacturing steps.

The two dimensional resolution of SSSEM is ultimately determined by the spot size of the electron beam on the sample surface, which is a simple function of the beam diameter. With current electro-optical design and construction technology, it is not difficult to obtain a beam with a diameter of less than 0.02 micron. For instance, a high-quality commercial electron gun (such as those used in Auger spectrometers) can deliver a beam with diameter less than 0.1 micron. By reducing the cathode emission current and careful coating of the lens elements, and other modifications well known to those skilled in the art of designing electron guns for applications such as spectrometers, the beam diameter can be further reduced down to about 0.02 micron. Electron beams of 0.02 micron diameter are sufficient for measuring the topology of semiconductor devices having a minimum feature size of 0.18 micron.

The diameter of an electron beam is mainly limited by the space-charge effect, which is significant in high current beams. But high current beams are not needed in SSSEM. Therefore it is anticipated that electron beam diameters significantly smaller than 0.02 micron will be possible. Also, even partially overlapping electron beam spots can still generate an interference signal. Thus, beam diameter is only a coarse indicator of the two dimensional resolution of an SSSEM.

It is a well known fact that conducting surfaces have high reflectivity for electrons. For semiconductors, electron reflectivity is typically on the order of one percent, with the exact reflectivity depending on the flatness of the surface, beam energy, beam incidence angle, and so on. Among the reflected electrons, only about 0.1 percent are inelastically scattered. Since the SSSEM only measures electrons that are elastically scattered, 99.9% of the reflected electrons are useful to the SSSEM. Hence, if the incoming beam has the strength of 1 picoamp ($10^{12-}$A), the current at the detector will be around $5 \times 10^4$ cps (counts per second), which is a strong signal in the context of the present invention. Furthermore, the SSSEM only responds to the total intensity (fixed-energy mode) or periodic features of the detected current (modulated-energy mode). Both of these types of signals are easy to detect and both have strong noise-suppression capability. When phase detection is incorporated into the interference signal detection system and is synchronized with the scanning and source signal modulation of the SSSEM, this further increases the signal to noise ratio of the system. The detection current relates only to the absolute difference of the beam paths. In other words, changes in the detection signal do not give information about which beam path is longer or shorter than the other. For simple structures such as those on a semiconductor wafer surface, the sign of $\delta x$ can be determined by software analysis and a surface contour map can then be constructed. For more complicated surfaces the sign of $\delta x$ can be directly detected by tilting the incidence angle slightly or by incorporating more than one set of source/detector pairs (e.g., using a con-focal configuration).

Since the SSSEM detection current depends only on the difference of the lengths of the beam paths rather than the path lengths themselves, the SSSEM is inherently insensitive to mechanical vibrations.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

Other objects, besides semiconductor wafers, that are suitable for topological measurements using the present invention include magnetic disks used for information storage, precision or micro-machined objects used in a variety of field, as well as biological structures.

What is claimed is:

1. A spin-split scanning electron microscope (SSSEM), comprising:

an electron beam source that generates a flying stream of electrons;

a spin-split electron beam splitter that splits the flying stream of electrons into first and second electron beams, said second electron beam having a different trajectory than said first electron beam;

an electron beam intensity detector that receives a reflected portion of said first and second electron beams after said first and second electron beams have been reflected from distinct positions of a target surface and that then interfere with each other so as to generate an interference intensity signal; and a controller coupled to the electron beam intensity detector for receiving the intensity signal, and for analyzing changes in said intensity signal to determine differences in path lengths of said first and second electron beams.

2. The SSSEM of claim 1, said spin-split electron beam splitter splitting said flying stream of electrons into first and second electron beams in accordance with each electron's spin-orientation relative to a non-uniform magnetic field, such that electrons in said stream of electrons having a spin-up orientation become one of said first and second electron beams and electrons in said stream of electrons having a spin-down orientation become the other one of said first and second electron beams.

3. The SSSEM of claim 1, said spin-split electron beam splitter including a magnetic field generator that generates a non-uniform magnetic field in a region of space intercepted by said flying stream of electrons; and said electrons in said flying stream of electrons each having a magnetic moment, said magnetic moment of a first portion of said electrons in said flying stream having a first alignment orientation with said magnetic field while said magnetic moment of a second portion of said electrons in said flying stream having a second alignment orientation with said magnetic field that is the opposite of said first alignment orientation; wherein said first portion of said electrons in said flying stream, after flying through said non-uniform magnetic field becomes said first electron beam and said second portion of said electrons in said flying stream, after flying through said non-uniform magnetic field becomes said second electron beam.

4. The SSSEM of claim 3, said spin-split electron beam splitter including a transverse electric field generator for applying an electric field to said flying stream of electrons to at least partially compensate for a Lorentz force experienced by said flying stream of electrons while flying through said magnetic field.

5. The SSSEM of claim 3, including an electron beam energy modulator for adjusting the kinetic energy of the electrons in said first and second electron beams.

6. The SSSEM of claim 5, said electron beam energy modulator modulating said kinetic energy of the electrons in said first and second electron beams so as to cause a change in energy of $\delta E$, said energy modulation causing oscillation of said interference intensity signal;

said controller monitoring oscillations of said interference intensity signal to generate a value N representing how many oscillations of said interference intensity signal occur during modulation of said electrons' kinetic energy, and computing from said value N a path length difference $\delta x$ representing a difference in the path lengths of said first and second electron beams.

7. The SSSEM of claim 1, including an electron beam energy modulator for adjusting the kinetic energy of the electrons in said first and second electron beams.

8. The SSSEM of claim 7, said electron beam energy modulator modulating said kinetic energy of the electrons in said first and second electron beams so as to cause a change in energy of $\delta E$, said energy modulation causing oscillation of said interference intensity signal;

said controller monitoring oscillations of said interference intensity signal to generate a value N representing how many oscillations of said interference intensity signal occur during modulation of said electrons' kinetic energy, and computing from said value N a path length difference $\delta X$ representing a difference in the path lengths of said first and second electron beams.

9. A method of measuring topological features of a target surface, comprising the steps of:

generating a flying stream of electrons;

splitting the flying stream of electrons into first and second electron beams, said second electron beam having a different trajectory than said first electron beam;

receiving a reflected portion of said first and second electron beams after said first and second electron beams have been reflected from distinct positions of the target surface and that then interfere with each other, and generating an interference intensity signal from said received portion of said first and second electron beams; and analyzing changes in said intensity signal to determine differences in path lengths of said first and second electron beams.

10. The method of claim 9, said beam splitting step including splitting said flying stream of electrons into first and second electron beams in accordance with each electron's spin-orientation relative to a non-uniform magnetic field, such that electrons in said stream of electrons having a spin-up orientation become one of said first and second electron beams and electrons in said stream of electrons having a spin-down orientation become the other one of said first and second electron beams.

11. The method of claim 9, said beam splitting step including generating a non-uniform magnetic field in a region of space intercepted by said flying stream of electrons; and said electrons in said flying stream of electrons each having a magnetic moment, said magnetic moment of a first portion of said electrons in said flying stream having a first alignment orientation with said magnetic field while said magnetic moment of a second portion of said electrons in said flying stream having a second alignment orientation with said magnetic field that is the opposite of said first alignment orientation; wherein said first portion of said electrons in said flying stream, after flying through said non-uniform magnetic field becomes said first electron beam and said second portion of said electrons in said flying stream, after flying through said non-uniform magnetic field becomes said second electron beam.

12. The method of claim 11, said beam splitting step including applying a transverse electric field to said flying stream of electrons to at least partially compensate for a Lorentz force experienced by said flying stream of electrons while flying through said magnetic field.

13. The method of claim 11, including dynamically adjusting the kinetic energy of the electrons in said first and second electron beams.

14. The method of claim 13, said kinetic energy adjusting step including modulating said kinetic energy of the electrons in said first and second electron beams so as to cause a change in energy of $\delta E$, said energy modulation causing oscillation of said interference intensity signal;

said analyzing step including monitoring oscillations of said interference intensity signal to generate a value N representing how many oscillations of said interference intensity signal occur during modulation of said electrons' kinetic energy, and computing from said value N a path length difference $\delta x$ representing a difference in the path lengths of said first and second electron beams.

15. The method of claim 1, including adjusting the kinetic energy of the electrons in said first and second electron beams.

16. The method of claim 15, said kinetic energy adjusting step including modulating said kinetic energy of the electrons in said first and second electron beams so as to cause a change in energy of $\delta E$, said energy modulation causing oscillation of said interference intensity signal;

said analyzing step including monitoring oscillations of said interference intensity signal to generate a value N representing how many oscillations of said interference intensity signal occur during modulation of said electrons' kinetic energy, and computing from said value N a path length difference $\delta x$ representing a difference in the path lengths of said first and second electron beams.

* * * * *